(12) United States Patent
van Dal et al.

(10) Patent No.: US 12,381,075 B2
(45) Date of Patent: *Aug. 5, 2025

(54) CUPROUS OXIDE DEVICES AND FORMATION METHODS

(71) Applicant: Taiwan Semiconductor Manufacturing Co., Ltd., Hsinchu (TW)

(72) Inventors: Marcus Johannes Henricus van Dal, Linden (BE); Peter Ramvall, Lund (SE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/662,267

(22) Filed: May 13, 2024

(65) Prior Publication Data

US 2024/0297037 A1 Sep. 5, 2024

Related U.S. Application Data

(60) Continuation of application No. 17/227,905, filed on Apr. 12, 2021, now Pat. No. 11,984,315, which is a
(Continued)

(51) Int. Cl.
*H01L 21/00* (2006.01)
*H01L 21/02* (2006.01)
(Continued)

(52) U.S. Cl.
CPC .. *H01L 21/02181* (2013.01); *H01L 21/02178* (2013.01); *H01L 21/02183* (2013.01);
(Continued)

(58) Field of Classification Search
CPC ......... H01L 21/02614; H01L 21/02483; H01L 21/02565; H01L 27/1225; H01L 29/41733;
(Continued)

(56) References Cited

U.S. PATENT DOCUMENTS 9,666,491 B1   5/2017 Zhou
10,978,292 B2 *  4/2021 van Dal ............ H01L 21/02178
(Continued)

FOREIGN PATENT DOCUMENTS

CN   104201175 A   12/2014

OTHER PUBLICATIONS

Ooi et al., "Formation of cuprous oxide via oxygen plasma." Thin Solid Films. 518 (2010) e98-e100. (Year: 2010).*
(Continued)

*Primary Examiner* — Reema Patel
(74) *Attorney, Agent, or Firm* — HAYNES AND BOONE, LLP

(57) ABSTRACT

Structures and methods of forming the same are provided. A structure according to the present disclosure includes an interconnect structure, an aluminum oxide layer over the interconnect structure, and a transistor formed over the aluminum oxide layer. The transistor includes cuprous oxide.

20 Claims, 23 Drawing Sheets

Related U.S. Application Data division of application No. 16/668,721, filed on Oct. 30, 2019, now Pat. No. 10,978,292.

(60) Provisional application No. 62/853,962, filed on May 29, 2019.

(51) Int. Cl.
*H10D 30/67* (2025.01)
*H10D 86/40* (2025.01)
*H10D 86/60* (2025.01)

(52) U.S. Cl.
CPC .. *H01L 21/02186* (2013.01); *H01L 21/02189* (2013.01); *H01L 21/02483* (2013.01); *H01L 21/02565* (2013.01); *H01L 21/02614* (2013.01); *H10D 30/67* (2025.01); *H10D 30/6729* (2025.01); *H10D 86/423* (2025.01); *H10D 86/441* (2025.01); *H10D 86/60* (2025.01)

(58) Field of Classification Search
CPC .. H01L 29/786; H10D 30/6729; H10D 30/67; H10D 86/423
See application file for complete search history.

(56) References Cited

U.S. PATENT DOCUMENTS

| | | | |
|---|---|---|---|
| 2006/0240642 A1* | 10/2006 | Kerdiles | H01L 21/76254 438/455 |
| 2017/0317182 A1* | 11/2017 | Huang | H01L 29/517 |
| 2019/0267319 A1 | 8/2019 | Sharma | |
| 2019/0296104 A1 | 9/2019 | Sharma | |

OTHER PUBLICATIONS

Deng, Bing et al., "Wrinkle-Free Single-Crystal Graphene Wafer Grown on Strain-Engineered Substrates," ACS Nano, www.acsnano.org, 2017, vol. 11, Received Aug. 31, 2017, Accepted Nov. 30, 2017, Published Nov. 30, 2017, pp. 12337-12345.

Li, B. S. et al., "Growth of Cu2O thin films with high hole mobility by introducing a low-temperature buffer layer," Journal of crystal Growth 311 (2009), pp. 1102-1105.

Minami, Tadatsugu et al., "Efficiency improvement of Cu2O-based heterojunction solar cells fabricated using thermally oxidized copper sheets," Thin Solid Films 558 (2014), 7 pages.

Zhang, Rui et al., "High-Mobility Fe p- and n-MOSFETs With 0.7-nm EOT Using HfO2/Al2O3/GeOx/Ge Gate Stacks Fabricated by Plasma Postoxidation," IEEE Transactions on Electron Devices, vol. 60, No. 3, Mar. 2013, pp. 927-934.

Zou, Xiao et al., "Improved Subthreshold Swing and Gate-Bias Stressing Stability of p-Type Cu2O Thin-Film Transistors Using a HfO2 High-k Gate Dielectric Grown on a SiO2/Si Substrate by Pulsed Laser Ablation," IEEE Transactions on Electron Devices, vol. 58, No. 7, Jul. 2011, pp. 2003-2007.

* cited by examiner

CUPROUS OXIDE DEVICES AND FORMATION METHODS

PRIORITY

This application is a continuation application of U.S. patent application Ser. No. 17/227,905, filed Apr. 12, 2021, which is a divisional application of U.S. patent application Ser. No. 16/668,721, filed Oct. 30, 2019, which claims priority to U.S. Provisional Patent Application Ser. No. 62/853,962, filed May 29, 2019, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, as a possible path for scaling down, peripheral devices such as power gates or input/output (I/O) devices may be moved from front-end-of-line (FEOL) levels into higher interconnect levels, such as those in the back-end-of-line (BEOL) levels. Power gates are used to switch off logic transistor blocks at standby to reduce static power consumption. The power gates may be transistors disposed in the FEOL levels. I/O devices serve as interface between a computing element (e.g. a central processing unit (CPU)) and the external circuitry (e.g. a hard drive) and may also be disposed in the FEOL levels. Some research suggests that such change could result in about 5-10% of area savings. One of the challenges to fabricate peripheral devices at the FEOL level is restricted thermal budget. While amorphous silicon transistors are well known and can be processed at low process temperatures, the carrier mobility of amorphous silicon may not be satisfactory to serve as BEOL power gate or I/O devices.

Although conventional semiconductor devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-4, 5A, 5B, 6A, 6B, 7A, 7B, 8A-1, 8A-2, 8B, 9A-1, 9A-2, 9B, 10A-1, 10A-2, 10B, 11A-1, 11A-2, 11B, and 12 are fragmentary cross-sectional diagrammatic views of a carrier substrate and an IC device at various fabrication stages of a method, such as the method of FIG. 1, according to various aspects of the present disclosure.

DETAILED DESCRIPTION

Figure 1:
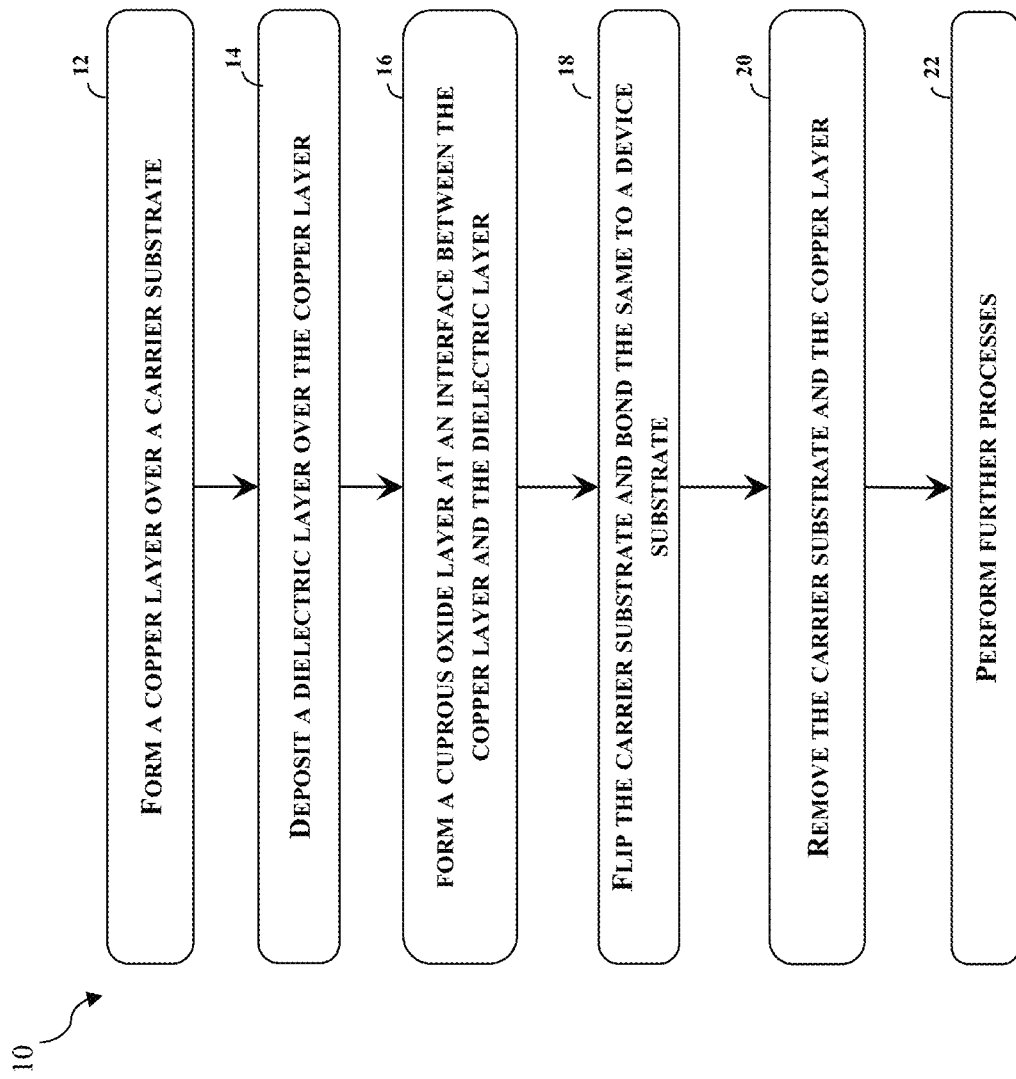
FIG. 1 illustrates a flow chart of a method for fabricating an IC device containing a cuprous oxide transistor, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to oxide semiconductor devices and methods of forming the same. More particularly, the present disclosure is related to cuprous oxide semiconductor devices and methods of forming cuprous oxide semiconductor devices.

Conventionally, peripheral devices such as power gates or input/output (I/O) devices are fabricated at the FEOL level. Power gates are used to switch off logic blocks at standby to reduce static power consumption. I/O devices serve as interface between a computing element (e.g. a central processing unit (CPU)) and the external circuitry (e.g. a hard drive) and may also be disposed in the FEOL levels. These peripheral devices may take precious area at the FEOL level. In some instances, the peripheral devices may require additional contact vias to couple to the logic blocks and the additional contact vias may take even more area. The general wisdom has been to move the peripheral devices to the BEOL levels. In this regard, while peripheral devise may also take up space at the BEOL level, the benefit of moving them to the BEOL levels still outweighs the cost (or impact) as area at the FEOL level becomes ever more precious. Some research suggests that moving the peripheral devices from FEOL levels to BEOL levels could result in about 5-10% of area savings. One of the challenges to fabricate peripheral devices at the FEOL level is restricted thermal budget. While amorphous silicon transistors are well known and can be processed at low process temperatures, the carrier mobility of amorphous silicon may not be satisfactory to serve as BEOL power gate or I/O devices.

Oxide semiconductor devices are considered alternatives to amorphous silicon semiconductor devices for power gate or I/O applications at BEOL levels. Among the known oxide semiconductor devices, InGaZnO (IGZO) thin-film transistor (TFT) technology is the most mature as IGZO TFTs are commercialized as gate drivers for high-frequency display applications. Other metal oxide semiconductor materials with higher electron mobilities include c-axis aligned crystal (CAAC) IGZO, ZnO, $In_2O_3$, $Ga_2O_3$, and ZnON are less mature. Most of the oxide semiconductors have low hole mobility as they have localized polarons and deep p-type levels. For that reason, those metal oxide semiconductor materials are not suitable for p-type transistors. However, p-type TFTs are essential for several applications. For example, in power gate applications, a logic block is coupled to Vdd (or header) via a p-type power gate TFT and coupled to Vss (or footer) via an n-type power gate TFT. In I/O applications, both n-type and p-type TFTs are needed. Only few oxide semiconductor materials are suitable for high mobility p-type oxide semiconductors. One of the few oxides that have semiconductor properties and a reasonably high mobility is cuprous oxide ($Cu_2O$). Performance of a cuprous oxide device depends on quality of the cuprous oxide layer.

However, the industry has been struggling to identify a reliable process to form high quality cuprous oxide and integrate the same in the BEOL processes. In some conventional techniques, cuprous oxide may be formed by thermally oxidation on a copper substrate. In some other conventional techniques, cuprous oxide may be formed by various types of physical vapor deposition (PVD), such as magnetic sputtering or pulsed laser deposition (PLD). In still other conventional techniques, cuprous oxide may be formed by molecular bean epitaxy (MBE) or chemical vapor deposition. For example, when magnetic sputtering is adopted, plasma of oxygen and argon is accelerated by an electric field to strike a copper target to deposit cuprous oxide and copper (II) oxide on a silicon oxide or glass substrate. When PLD is adopted, pulsed laser strikes a copper target in an oxygen ambient to deposit cuprous oxide on a substrate that is formed of silicon oxide, hafnium oxide, or magnesium oxide. These conventional techniques may not consistently produce a crystalline cuprous oxide and may require a high process temperature greater than 500° C. to yield crystalline cuprous oxide. For example, the process temperature for a conventional thermal oxidation process may be between 400° C. and 1015° C. The process temperature for a conventional magnetic sputtering may be between about 200° C. and about 850° C. The process temperature for a conventional pulsed laser deposition may be between 400° C. and 700° C. High process temperature may result in diffusion of contaminants and impurities, causing reduced device performance or reliability. In addition, some of these conventional techniques require use of sodium as a dopant while sodium has long been regarded as a contaminant in the semiconductor industry.

The present disclosure provides embodiments of methods for forming crystalline $Cu_2O$ layers and using the crystalline $Cu_2O$ layers to fabricate transistors in BEOL levels. In some embodiments, a high quality cuprous oxide layer with a (111) crystal plane may be formed by oxidation between a high quality crystalline Cu layer formed on a carrier substrate and an inert dielectric layer. In some implementations, the inert dielectric layer may be formed of aluminum oxide ($Al_2O_3$) and the carrier substrate may be a sapphire substrate. In some embodiments, the oxidation is performed by a plasma oxidation (or plasma-enhanced oxidation) process to control the supply of oxygen to form a Cu-rich oxide phase in a controlled fashion. In some instances, the plasma oxidation process may be performed at a temperature between about 350° C. and about 450° C., including 400° C. In some embodiments, the cuprous oxide film may be transferred on a workpiece for further processing.

FIG. 1 illustrate a flow chart of a method 10 for fabricating an integrated circuit (IC) device according to various aspects of the present disclosure. Additional steps can be provided before, during, and after the method 10, and some of the steps described can be replaced or eliminated for other embodiments of the method 10. Blocks of the method 10 of FIG. 1 may be better described in conjunction with FIGS. 2-4, 5A, 5B, 6A, 6B, 7A, 7B, 8A-1, 8A-2, 8B, 9A-1, 9A-2, 9B, 10A-1, 10A-2, 10B, A-1, 11A-2, 11B, and 12, which are fragmentary cross-sectional diagrammatic views of a carrier substrate 102 and a workpiece 400 at various fabrication stages of a method, such as method 10 of FIG. 1. The IC device to be formed from the workpiece 400 can be included in a microprocessor, a memory, and/or other IC device. In some implementations, workpiece 400 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-4, 5A, 5B, 6A, 6B, 7A, 7B, 8A-1, 8A-2, 8B, 9A-1, 9A-2, 9B, 10A-1, 10A-2, 10B, 11A-1, 11A-2, 11B, and 12 have been simplified for the sake of clarity to better understand the inventive concepts of the present disclosure. Additional features can be added in workpiece 400, and some of the features described below can be replaced, modified, or eliminated in other embodiments of workpiece 400.

Figure 2:
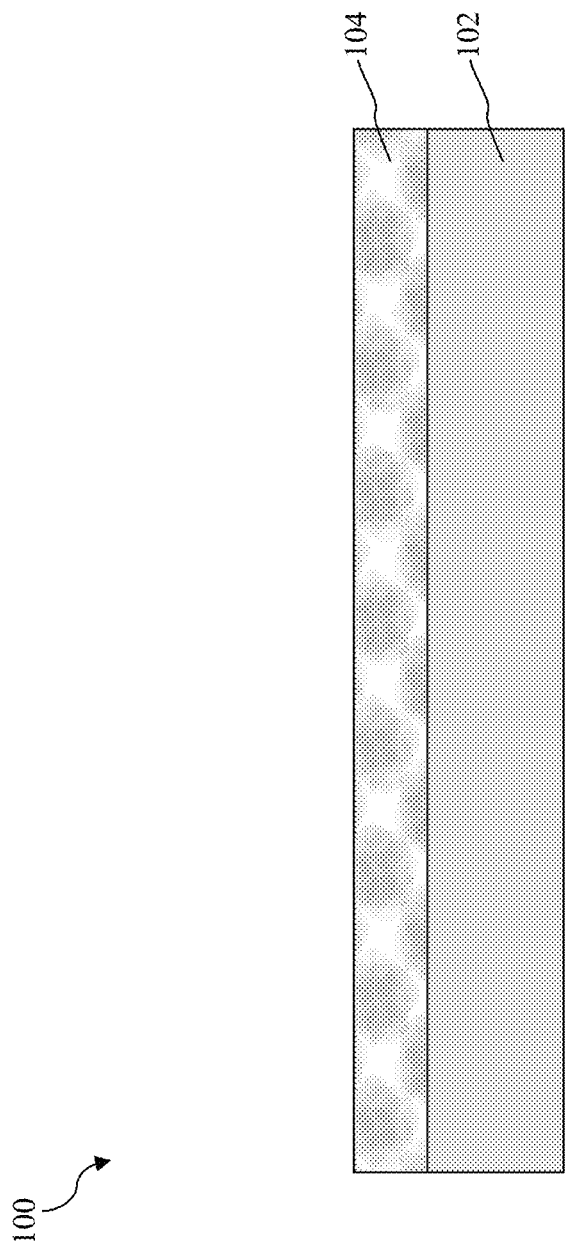

Referring to FIGS. 1 and 2, the method 10 includes a block 12 where a copper layer 104 is formed over a carrier substrate 102. In some embodiments, the copper layer formation technique and carrier substrate 102 at block 12 are selected to form a crystalline copper layer 104. More specifically, the copper layer formation technique and the carrier substrate 102 at block 12 are selected such that the copper layer 104 is crystalline or single-crystalline and has its (111) crystal plane extending on the surface of the carrier substrate 102. That is, a normal direction of the surface of the carrier substrate 102 is parallel to a [111] direction of the copper layer 104. For ease of reference, the carrier substrate 102 and the copper layer 104 (and further layers to be formed over the carrier substrate 102) may be collectively referred to as a carrier workpiece 100. In some embodiments, the carrier substrate 102 may include silicon (Si), hafnium oxide ($HfO_2$), silicon oxide ($SiO_2$), glass, magnesium oxide (MgO), aluminum oxide ($Al_2O_3$), silicon phosphide (SiP), indium phosphide (InP), gallium arsenide (GaAs), silicon carbide (SiC), or other material that are suitable for formation of the copper layer 104 thereon. In some embodiments, the technique used to form the copper layer 104 may include atomic layer deposition (ALD), molecular beam epitaxy (MBE), metalorganic chemical vapor deposition (MOCVD), other suitable deposition technique, or other epitaxy technique.

Figure 3:
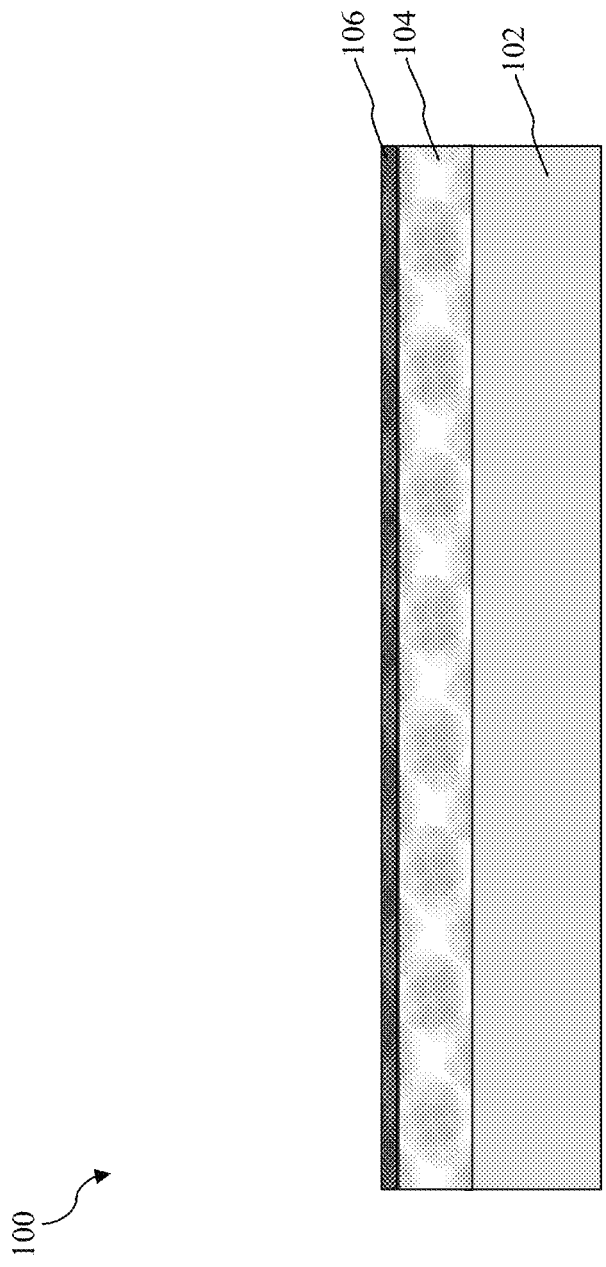

Referring now to FIGS. 1 and 3, the method 10 includes a block 14 where a dielectric layer 106 is deposited over the copper layer 104. In some embodiments, the dielectric layer 106 is an inert dielectric layer that does not react with oxygen or copper. In some implementations, the dielectric layer 106 may be an aluminum oxide layer, a hafnium oxide layer, a titanium oxide layer, a tantalum oxide layer, a zirconium oxide layer, a suitable inert dielectric layer, or a combination thereof. In some instances, the dielectric layer 106 is formed by ALD or CVD and the process to form the dielectric layer 106 is selected such that the dielectric layer 106 is amorphous. In the present disclosure where a cuprous oxide ($Cu_2O$) layer is desirable, if too much oxygen-containing gas is allowed to react with the copper layer 104, the more oxygen-rich $CuO_2$ or $CuO$, instead of cuprous oxide ($Cu_2O$), may be formed. Because molecules of an ambient gas species are to diffuse through the dielectric layer 106 before they reach the copper layer 104, the dielectric layer 106 serves as a restrictor to control the amount of ambient gas species to reach the copper layer 104 and to prevent too much oxygen from reacting with the copper layer 104. The amount or rate of oxygen to be in contact with the copper layer 104 depends on a thickness of the dielectric layer 106 and properties of dielectric layer 106. While the dielectric layer 106 is needed to control the supply of oxygen to the copper layer 104, the dielectric layer 106 may not be so thick that the supply of oxygen species is overly restricted. In some example, the thickness of the dielectric layer 106 is between about 1 nm and about 5 nm.

Figure 4:
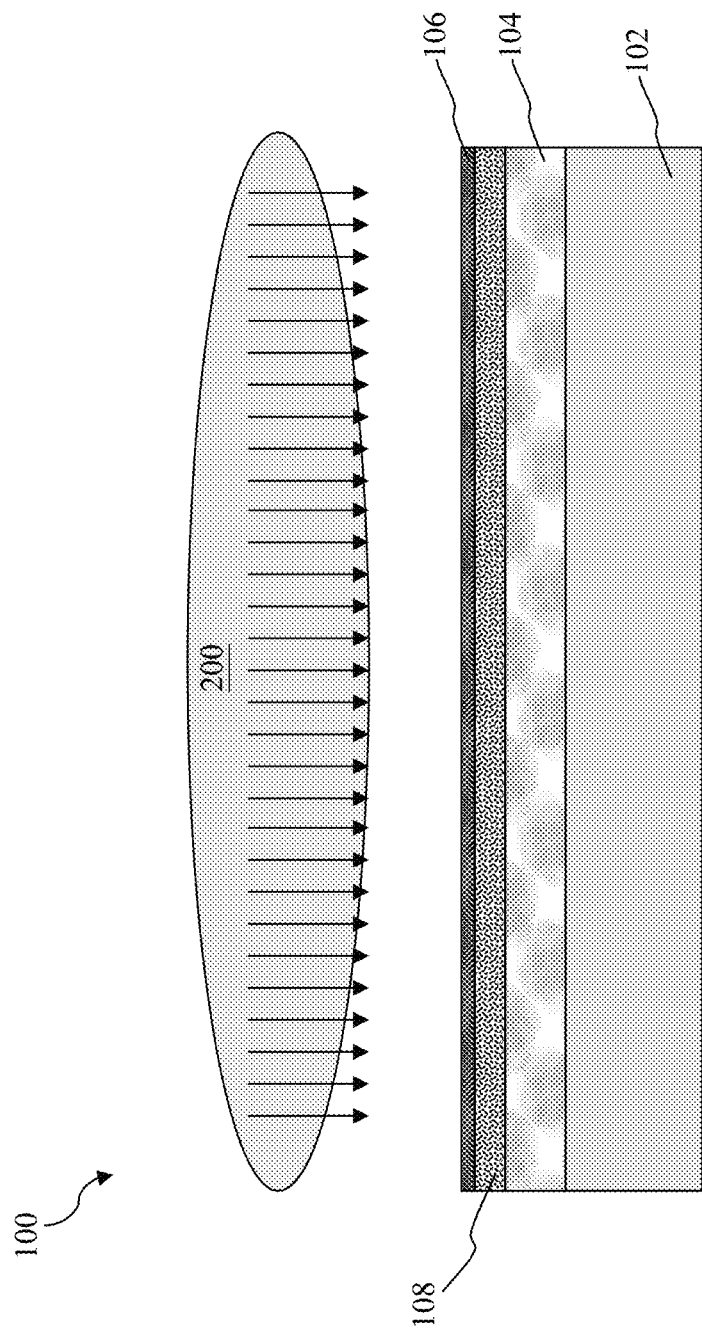
Figure 5A:
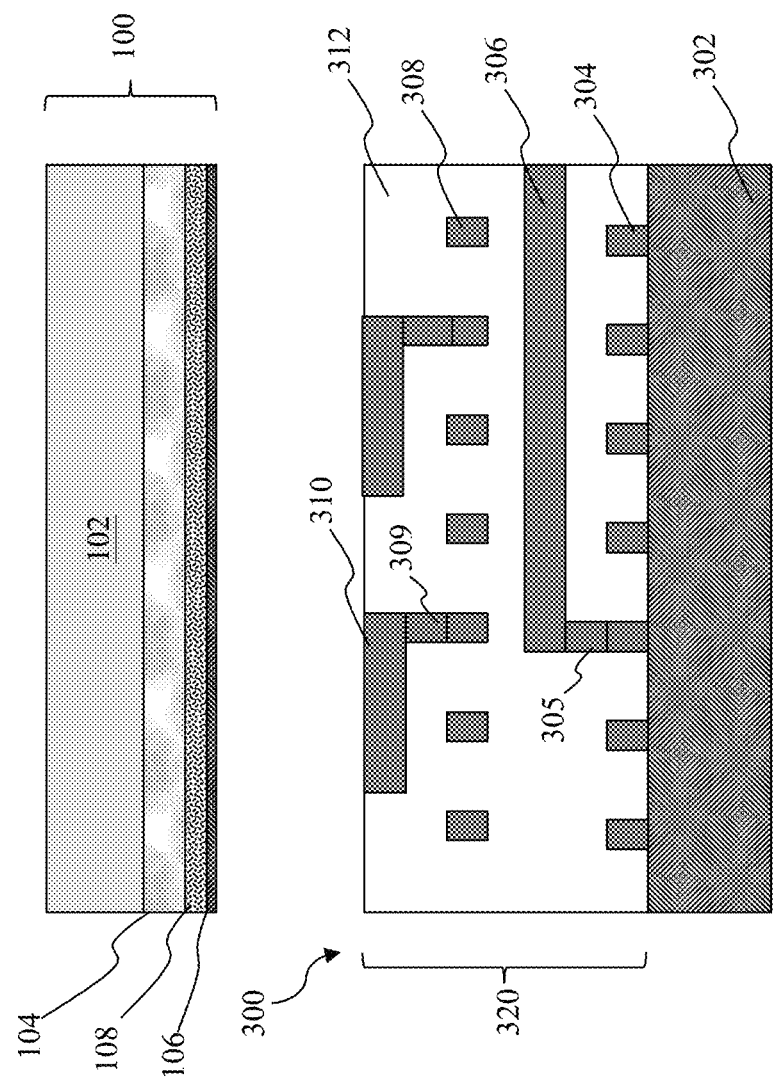
Figure 5B:
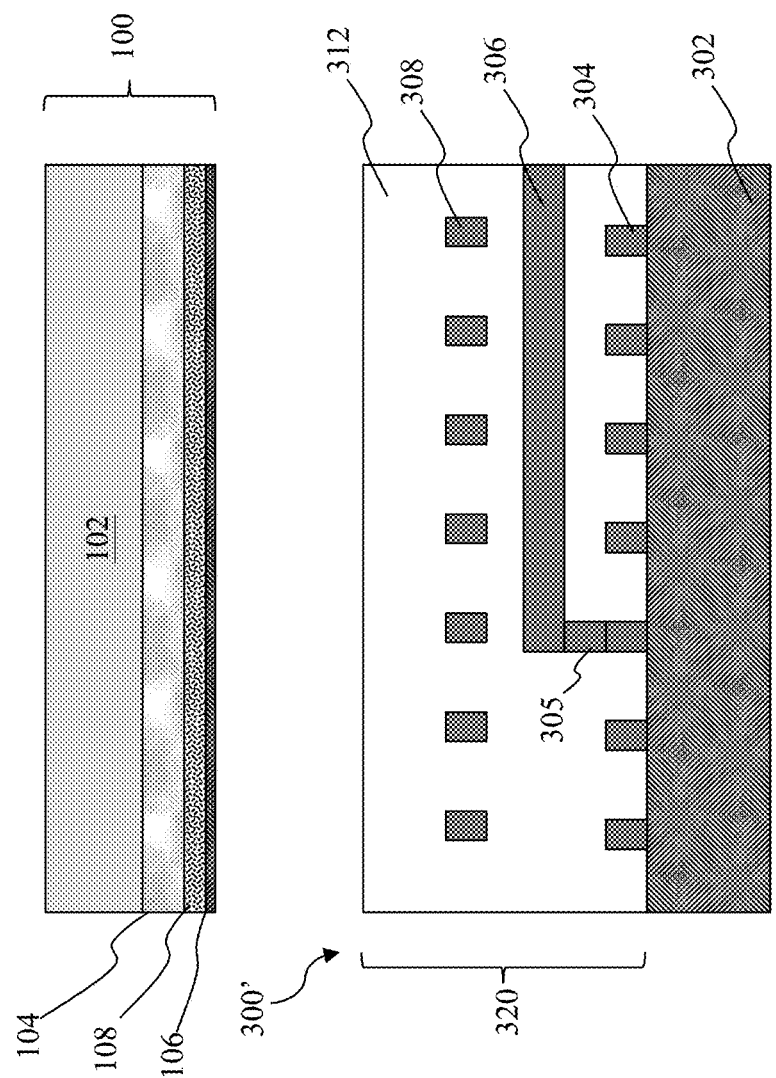

Referring to FIGS. 1 and 4, the method 10 includes a block 16 where a cuprous oxide layer 108 is formed at an interface between the copper layer 104 and the dielectric layer 106. In some embodiments, a plasma oxidation process (or a plasma-enhanced oxidation) may be adopted at block 16. In these embodiments, oxygen gas ($O_2$) and ozone ($O_3$) may be ignited into an oxygen-containing plasma 200 either locally at a reaction chamber where the carrier substrate 102 is located or remotely at a plasma source. The oxygen-containing plasma 200 may diffuse through the dielectric layer 106 and oxidize the copper layer 104 at the interface to form a copper-rich phase-a cuprous oxide layer 108. The use of plasma may reduce the oxidation temperature. In some instances, the oxidation temperature at the reaction chamber may be between about 300° C. and about 450° C., including about 400° C. However, even if higher temperature is needed, there will not be any impact on the thermal budget because the cuprous oxide layer 108 is first formed on a carrier substrate and then transferred to a device substrate. In some embodiments, the cuprous oxide layer 108 is formed to a thickness between about 5 nm and about 50 nm. The cuprous oxide layer 108 formed using methods of the present disclosure may be crystalline or single-crystalline and have its (111) crystal plane extending on the surface of the copper layer 104. That is, a normal direction of the surface of the copper layer 104 is parallel to a [111] direction of the cuprous oxide layer 108.

According to some embodiments of the present disclosure, the cuprous oxide layer 108 is to be transferred to a device substrate before the cuprous oxide layer 108 is formed into a thin-film transistor (TFT). The TFT may be formed using a back gate TFT process or a front gate TFT process. For illustration purposes, an example back gate TFT process is shown in FIGS. 5A, 6A, 7A, 8A-1, 8A-2, 9A-1, 9A-2, 10A-1, 10A-2, 11A-1, and 11A-2 and an example front gate TFT process is shown in FIGS. 5B, 6B, 7B, 8B, 9B, 10B, and 11B. Regardless of the choice of process, the cuprous oxide layer 108 is first transferred to a surface of an interconnect structure for further processing into a TFT for I/O or power gate applications. As will be clear from the description below, a difference between the back gate TFT process and the front gate TFT process is whether is a gate of the TFT is formed before or after the cuprous oxide layer 108 is transferred to a device workpiece. When the back gate TFT process is adopted, the gate of the TFT has already been formed on the surface of the device workpiece. When the front gate TFT process is adopted, the device workpiece does not include a gate for the TFT and the gate is formed after the cuprous oxide layer 108 is transferred to the device workpiece. For ease of reference, a device workpiece with a gate for the TFT is referred to as a device workpiece 300 in FIGS. 5A, 6A, 7A, 8A-1, 8A-2, 9A-1, 9A-2, 10A-1, 10A-2, 11A-1, and 11A-2; and a device workpiece without any gate for the TFT is referred to as a device workpiece 300' in FIGS. 5B, 6B, 7B, 8B, 9B, 10B, and 11B.

Referring now to FIGS. 1, 5A, 5B, 6A, and 6B, the method 10 includes a block 18 where the carrier workpiece 100 is flipped over and bonded to a device workpiece 300 (or a device workpiece 300'). In some embodiments represented in FIGS. 5A and 6A, the device workpiece 300 (or the device workpiece 300') includes a device substrate 302 and an interconnect structure 320 formed thereon. It is noted that the depiction of the device substrate 302 is simplified and does not include all the features envisioned by the present disclosure. For example, the device substrate 302 may include a semiconductor substrate and various FinFETs, GAA transistors, and contacts. The interconnect structure 320 includes one ore metal line layers and one or more contact vias. For example, the portion of the interconnect structure 320 in FIG. 5A includes a first metal line layer 304, a second metal line layer 306, a third metal line layer 308, and a fourth metal line layer 310. In some instances, the fourth metal line layer 310 may serve as a gate for the TFT. The metal line layers in the device workpiece 300 may be electrically coupled by one or more contact vias. For example, a first contact via 305 may couple the first metal line layer 304 and the second metal line layer 306; and a second contact via 309 may couple the third metal line layer 308 and the fourth metal line layer 310. The portion of the interconnect structure 320 of the device workpiece 300' in FIG. 5B does not include the fourth metal line layer 310 to serve as a gate for the TFT. Similarly, the portion of the interconnect structure 320 of the device workpiece 300' in FIG. 5B also does not include the second contact via 309 coupled to the fourth metal line layer 310. The foregoing metal line layers and the contact vias are embedded in an intermetal dielectric layer 312. While not depicted, the intermetal dielectric layer 312 may stand for multiple dielectric layers that are formed along with each of the metal line layers.

Figure 6A:
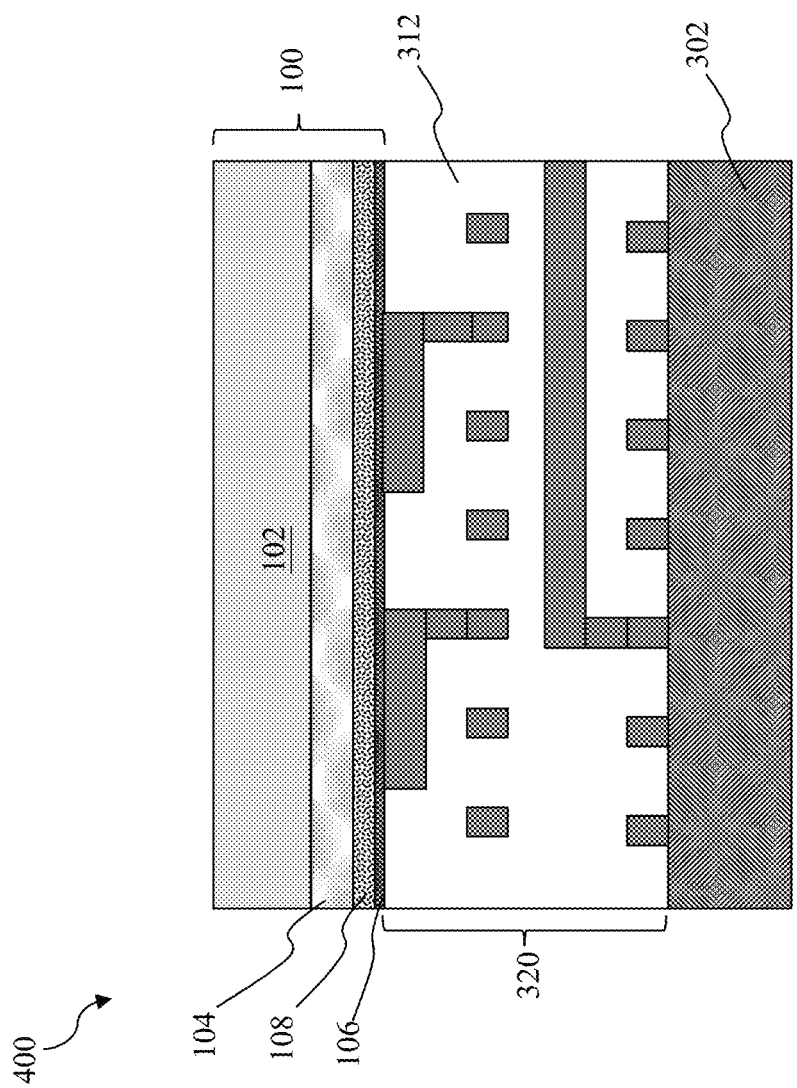
Figure 6B:
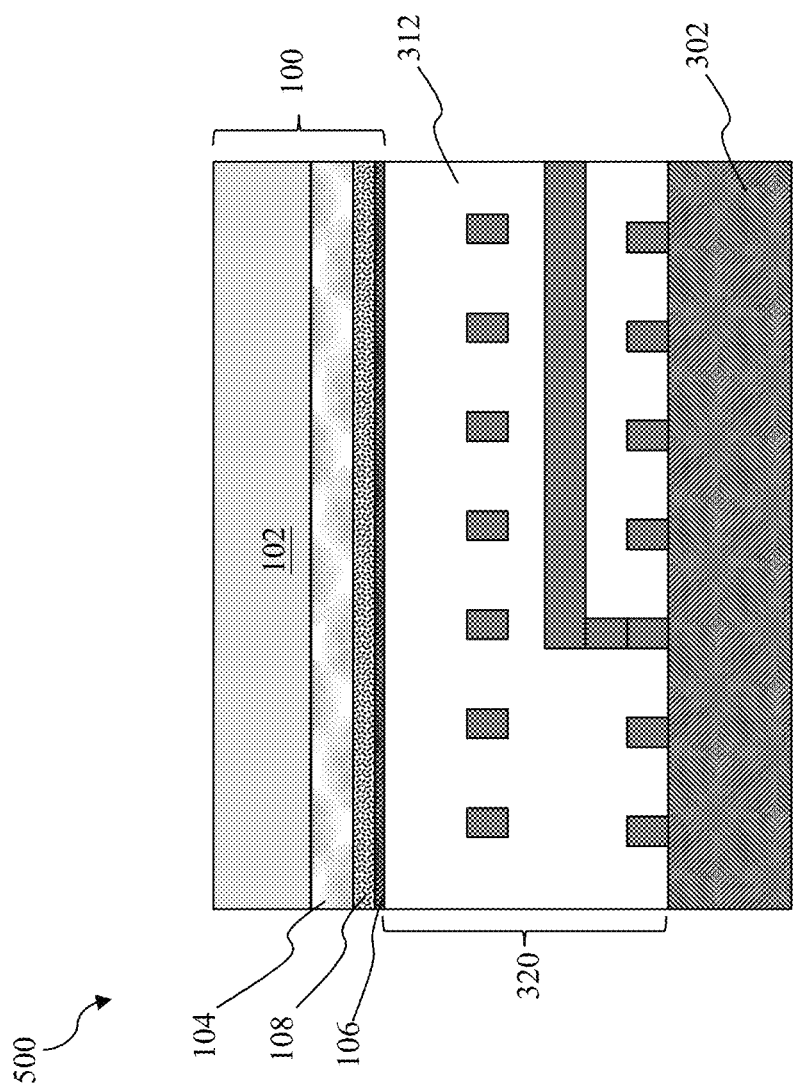

In some embodiments, the carrier workpiece 100 is bonded to the device workpiece 300 (or the device workpiece 300') by fusion bonding or direct bonding. In these embodiments, a planarized top surface of the dielectric layer 106 and a planarized top surface of the device workpiece 300 (or the device workpiece 300') may be cleaned in a cleaning process to remove contaminants and particles. In some implementations, the cleaning process may include a plasma treatment, UV/ozone cleaning, or a wet cleaning. For example, the cleaning process may include use of Standard Clean-1 (SC-1) and Standard Clean-2 (SC-2) to clean the planarized top surfaces of the dielectric layer 106 and the device workpiece 300 (or the device workpiece 300'). SC-1 includes ammonia and hydrogen peroxide and may be used for removing organic contaminants and particles. SC-2 includes hydrochloric acid and hydrogen peroxide may be used to remove metal ions. After the cleaning process, the planarized top surfaces of the dielectric layer 106 and the device workpiece 300 (or the device workpiece 300') may be rinsed with deionized water. After the rinse, the top surfaces of the dielectric layer 106 and the device workpiece 300 (or the device workpiece 300') are aligned and put in contact with one another, as illustrated in FIG. 6A or 6B. Bonding may begin as soon as the top surfaces of the dielectric layer 106 and the device workpiece 300 (or the device workpiece 300') are in atomic contact. In some implementations, an anneal process may be performed to accelerate and facilitate the bonding process. In the depicted embodiments, the dielectric layer 106 is formed of aluminum oxide and the top surface of the device workpiece 300 (or the device workpiece 300') includes intermetal dielectric layer 312 that may be formed of silicon oxide. The bonding process at block 18 bond the aluminum oxide of the dielectric layer 106 and the silicon oxide of the intermetal dielectric layer 312. In some alternative embodiments not separately illustrated in FIGS. 5A and 5B, a high-k (dielectric constant greater than 3.9) dielectric layer may be formed over the dielectric layer 106 before the carrier workpiece 100 is flipped over and bonded to the device workpiece 300. In those alternative embodiments, the high-k dielectric layer is bonded to the silicon oxide surface of the intermetal dielectric layer 312. For ease of reference, after the carrier workpiece 100 is flipped over and bonded to the device workpiece 300 as shown in FIG. 6A, they may be collectively referred to as a workpiece 400. Similarly, after the carrier workpiece 100 is flipped over and bonded to the device workpiece 300' as shown in FIG. 6B, they may be collectively referred to as a workpiece 500.

Figure 7A:
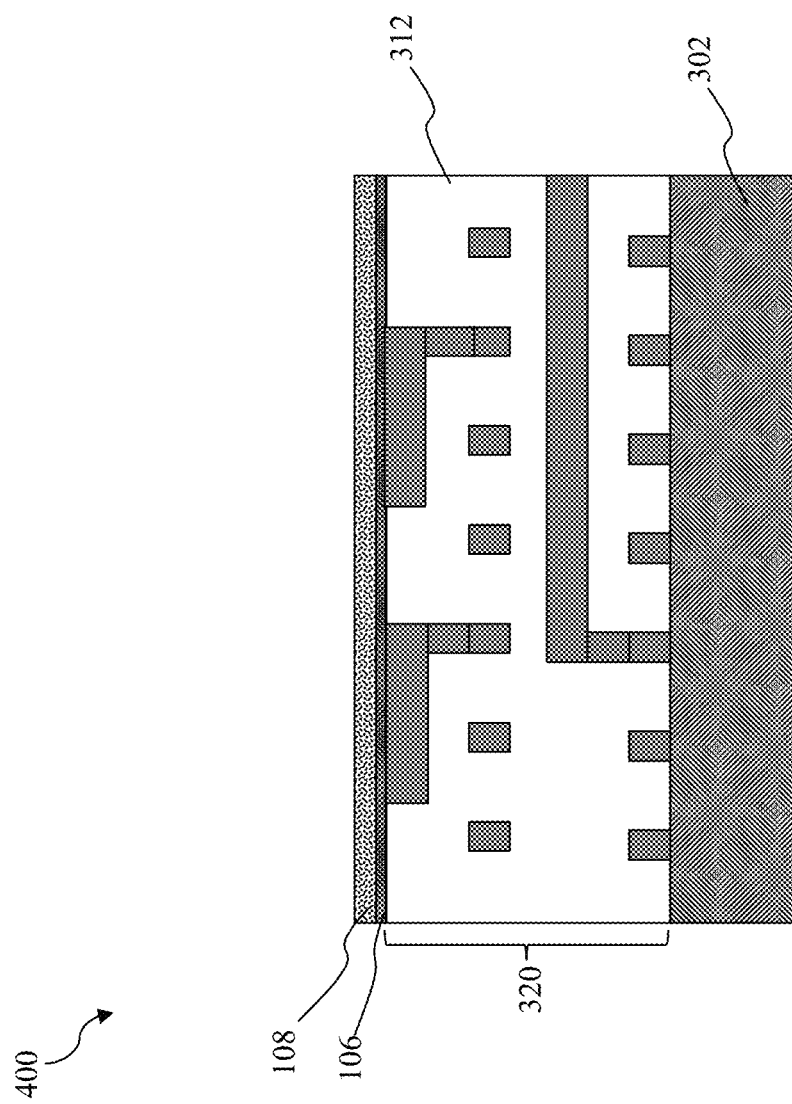
Figure 7B:
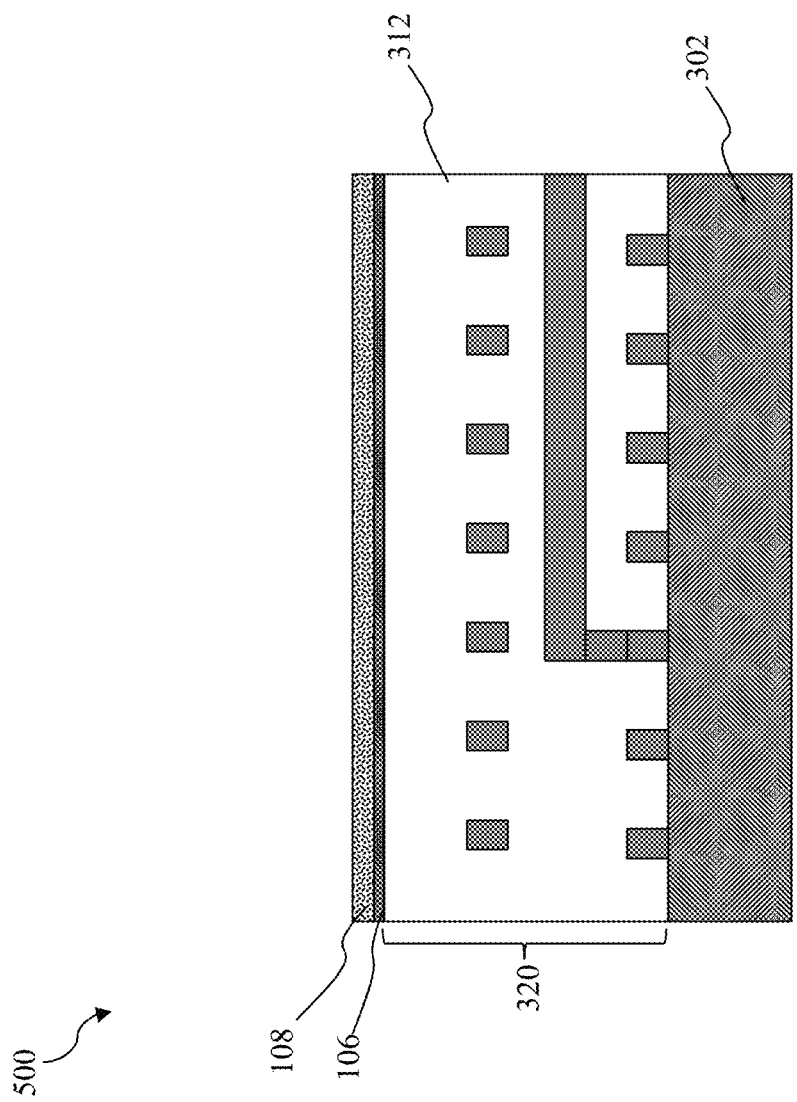

Referring to FIGS. 1, 7A and 7B, the method 10 includes a block 20 where the carrier substrate 102 and the copper layer 104 are removed. In some embodiments, the carrier substrate 102 and the copper layer 104 may be removed by a planarization process, a dry etch process, a wet etch process, a suitable etch process, or a combination thereof. For example, the carrier substrate 102 and the copper layer 104 may be removed by a chemical mechanical polishing (CMP) process. In some implementations, the carrier substrate 102 and the copper layer 104 may be removed using two different processes. In some embodiments represented in FIGS. 7A and 7B, the cuprous oxide layer 108 is exposed after operations at block 20.

Figures 1, 8A:
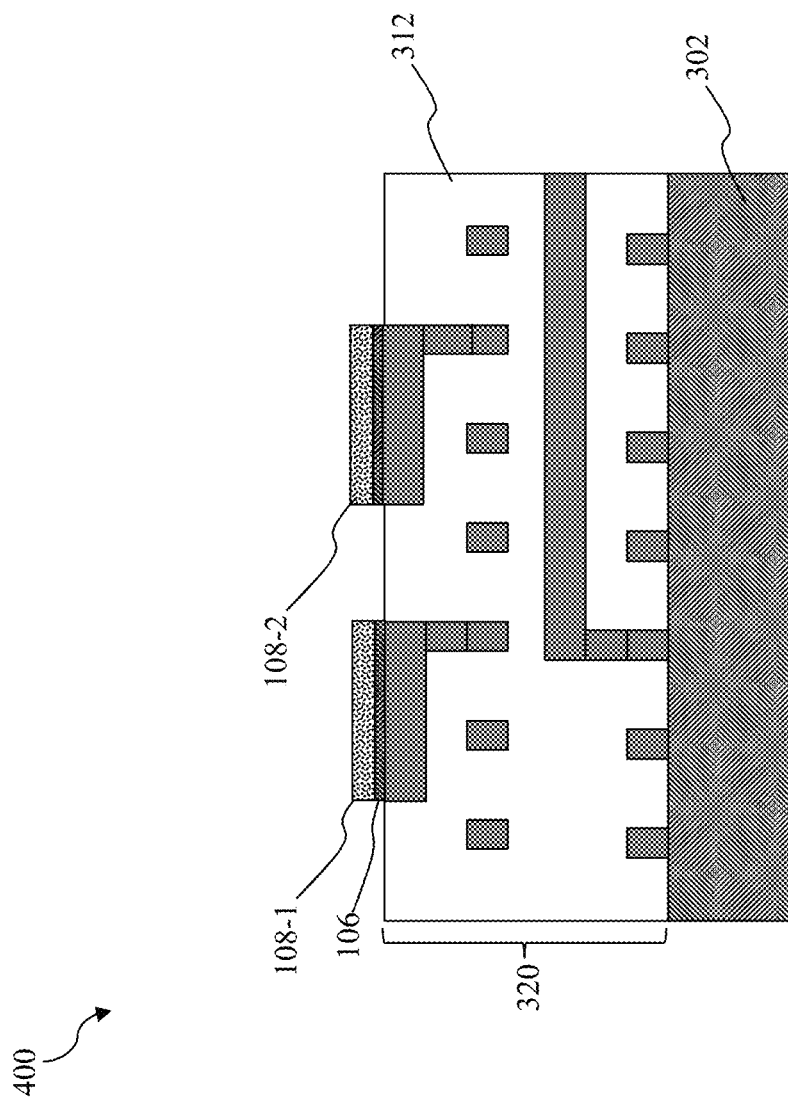
Figures 2, 8A:
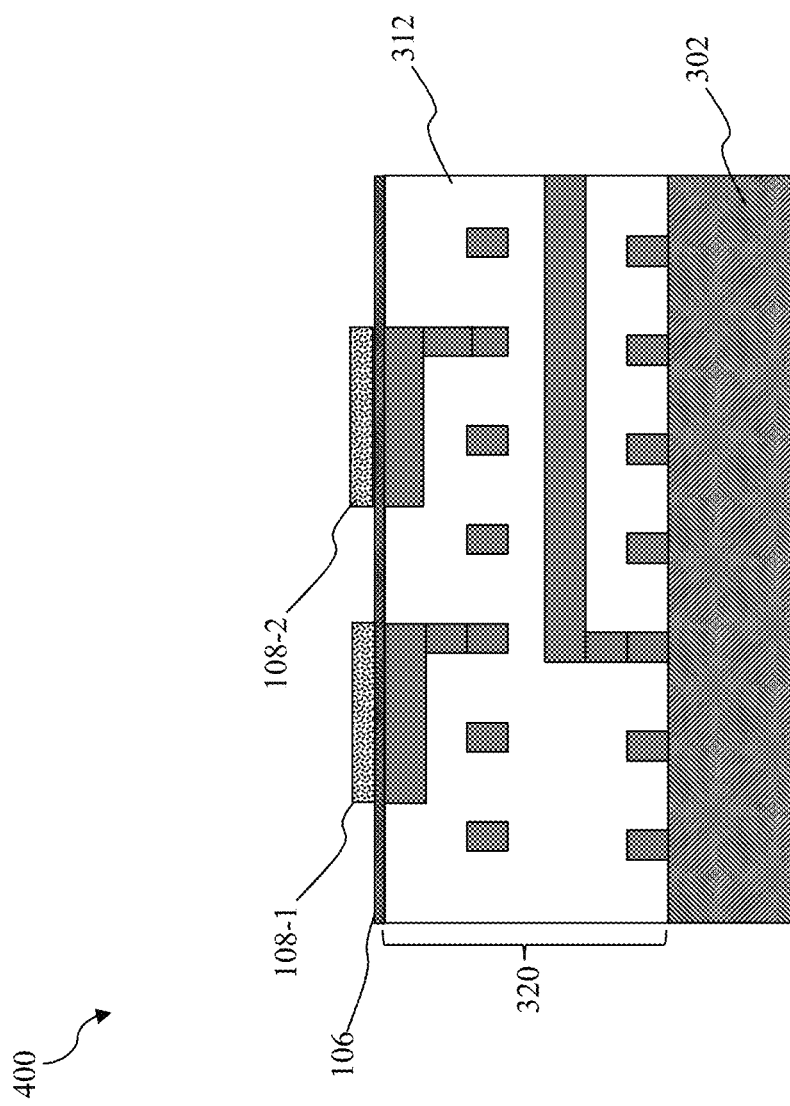
Figure 8B:
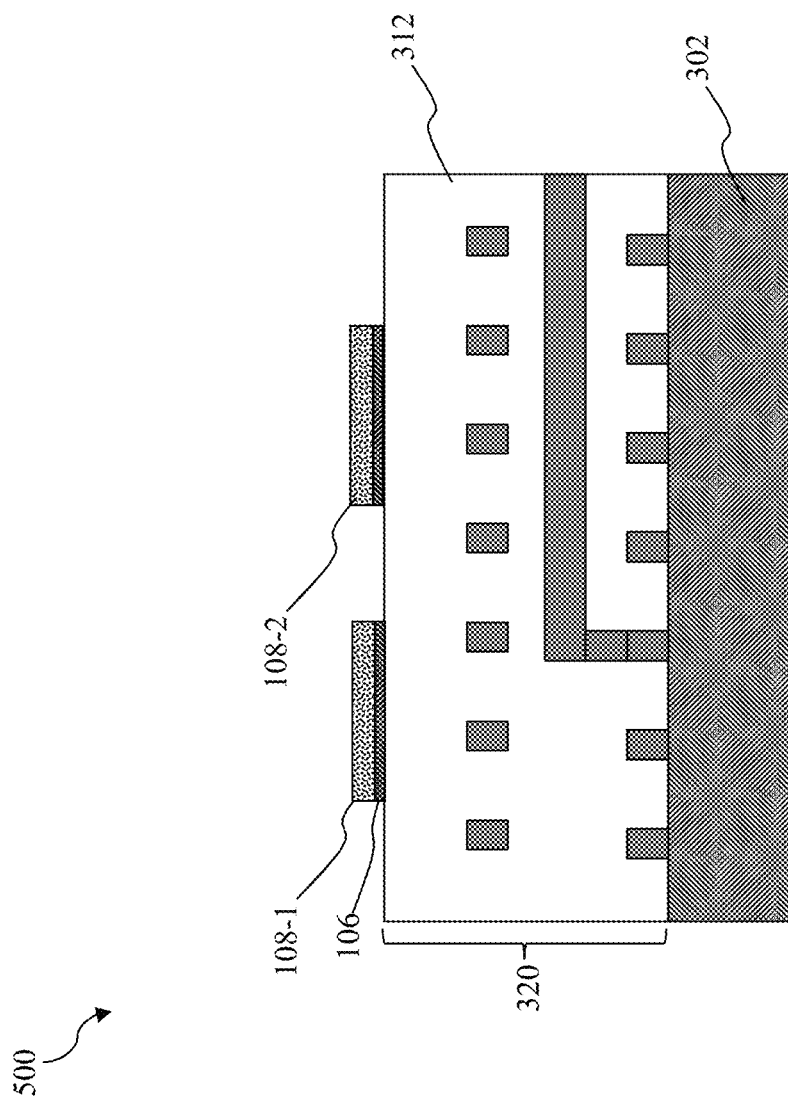

Referring now to FIGS. 1, 8A-1, 8A-2, 8B, 9A-1, 9A-2, 9B, 10A-1, 10A-2, 10B, 11A-1, 11A-2, and 11B, the method 10 includes a block 22 where further processes are performed. In some embodiments, such further processes include those to fabricate transistors using the cuprous oxide layer 108. Referring now to FIG. 8A-1, the cuprous oxide layer 108 and the dielectric layer 106 on the workpiece 400 may be patterned using a photolithography process. For example, a hard mask may be deposited over the workpiece 400 and a photoresist layer may be deposited over the hard mask. The photoresist layer may then be exposed to radiation reflected from or going through a mask. After a post bake process, the exposed photoresist layer may be developed to form a pattern photoresist layer. The hard mask may then be etched using the patterned photoresist layer as an etch mask to form a patterned hard mask. Thereafter, the cuprous oxide layer 108 and the dielectric layer 106 may be etched using the patterned hard mask as an etch mask to form one or more cuprous oxide features, such as cuprous oxide features 108-1 and 108-2 in FIG. 8A-1. Each of the one or more cuprous oxide features is spaced apart from the workpiece 400 by the dielectric layer 106. In some embodiments shown in FIG. 8A-1, the dielectric layer 106 may also be etched along with the cuprous oxide layer 108 and may be substantially coterminous with the cuprous oxide features 108-1 or 108-2. In some alternative embodiments shown in FIG. 8A-2, only the cuprous oxide layer 108 is etched and patterned at block 22 and the dielectric layer 106 not covered by the cuprous oxide features 108-1 and 108-2 are not substantially etched. Referring now to FIG. 8B, when a front gate TFT process is adopted, the cuprous oxide layer 108 and the dielectric layer 106 on the workpiece 500 may be similarly patterned using a photolithography process, such as cuprous oxide features 108-1 and 108-2.

Figures 1, 9A:
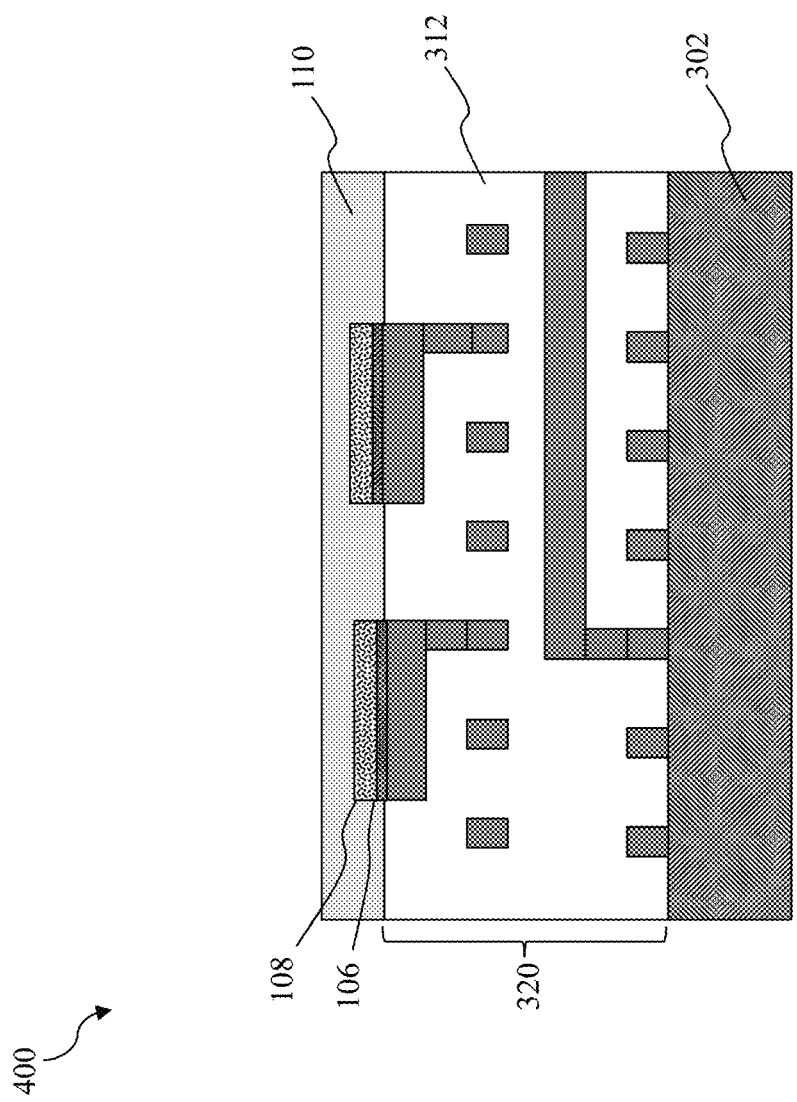
Figures 2, 9A:
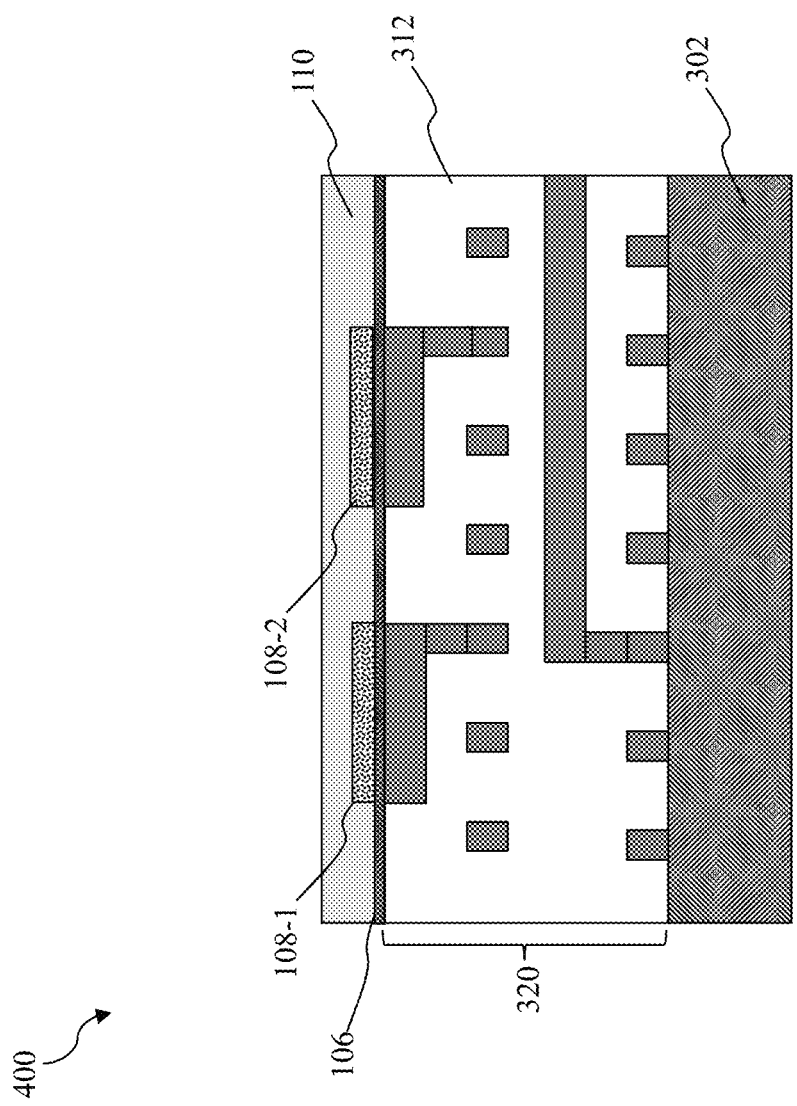

Referring now to FIGS. 9A-1 and 9A-2, an insulation layer 110 may be deposited over the workpiece 400, including over the cuprous oxide features 108-1 and 108-2. In some embodiments, the insulation layer 110 may be similar to the intermetal dielectric layer 312. For example, the insulation layer 110 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. Illustrations in FIG. 9A-1 represent embodiments where the dielectric layer 106 is patterned along with the cuprous oxide layer 108. Illustrations in FIG. 9A-2 represent embodiments where the dielectric layer 106 is not patterned or not substantially patterned along with the cuprous oxide layer 108.

Figure 9B:
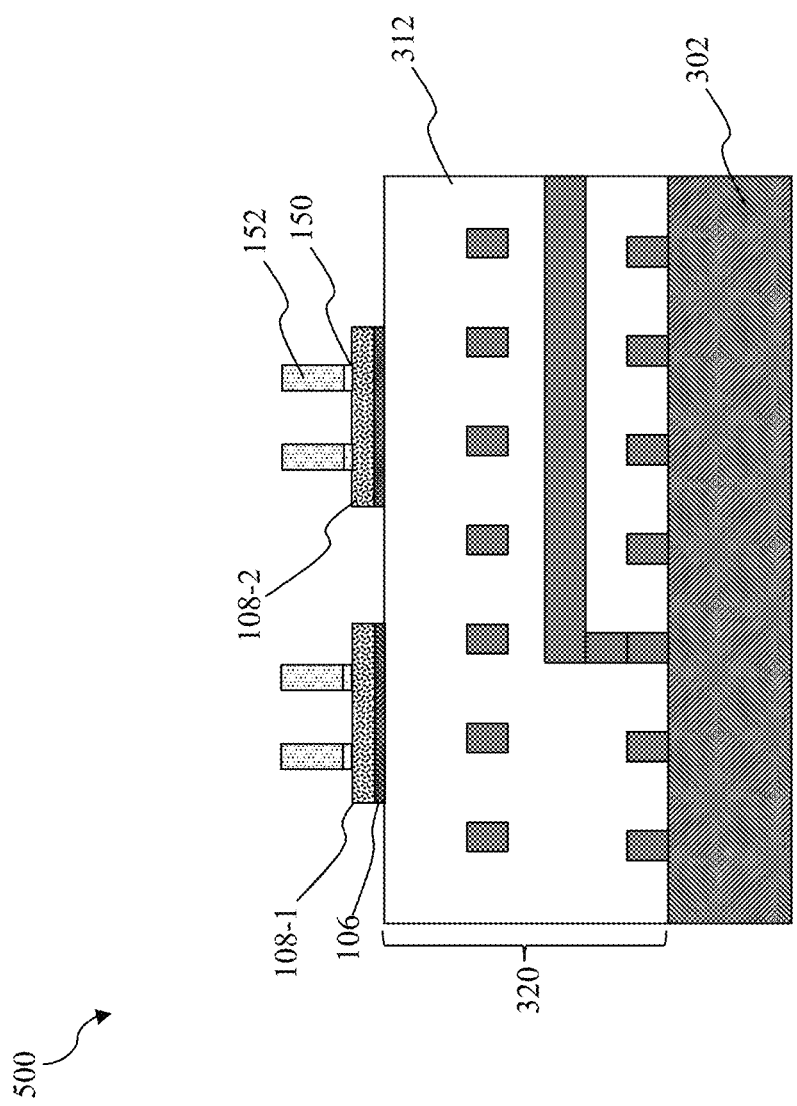

Referring to FIG. 9B, when a front gate TFT process is adopted, a gate dielectric layer 150 and a gate electrode 152 may be formed on each of the cuprous oxide features 108-1 and 108-2. In some embodiments, the gate dielectric layer 150 may include silicon nitride, hafnium oxide, aluminum oxide, a suitable high-k dielectric material, or a combination thereof. The gate electrode 152 may include platinum (Pt), copper (Cu), tungsten (W), nickel (Ni), cobalt (Co), aluminum (Al), ruthenium (Ru), molybdenum (Mo), or a combination thereof. An example process to form the gate dielectric layer 150 and the gate electrode 152 may include deposition of a blanket gate dielectric layer over the workpiece 500, including over the cuprous oxide features 108-1 and 108-2, depositing a photoresist layer over the blanket gate dielectric layer, formation of gate electrode openings in the photoresist layer, deposition of the gate electrode material in the openings, removal of the excess gate electrode material, removal of the photoresist layer, and selective etching of the blanket gate dielectric layer using the gate electrode as an etch mask.

Figures 1, 10A:
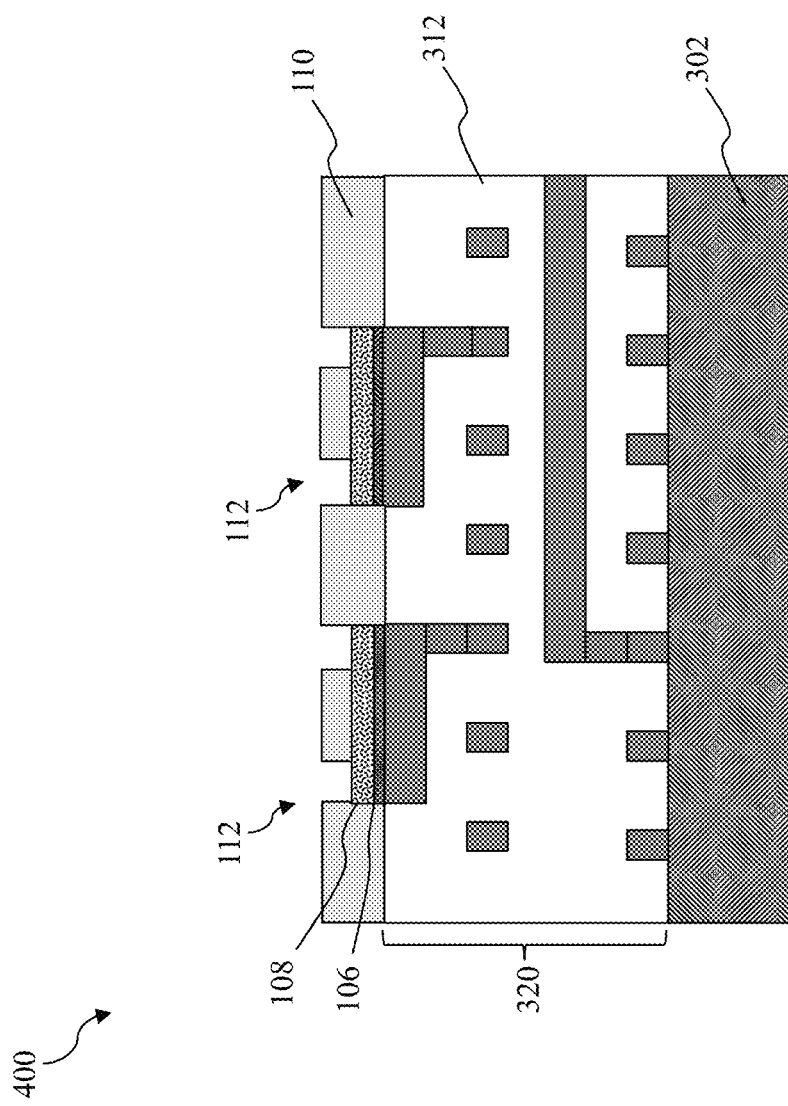
Figures 2, 10A:
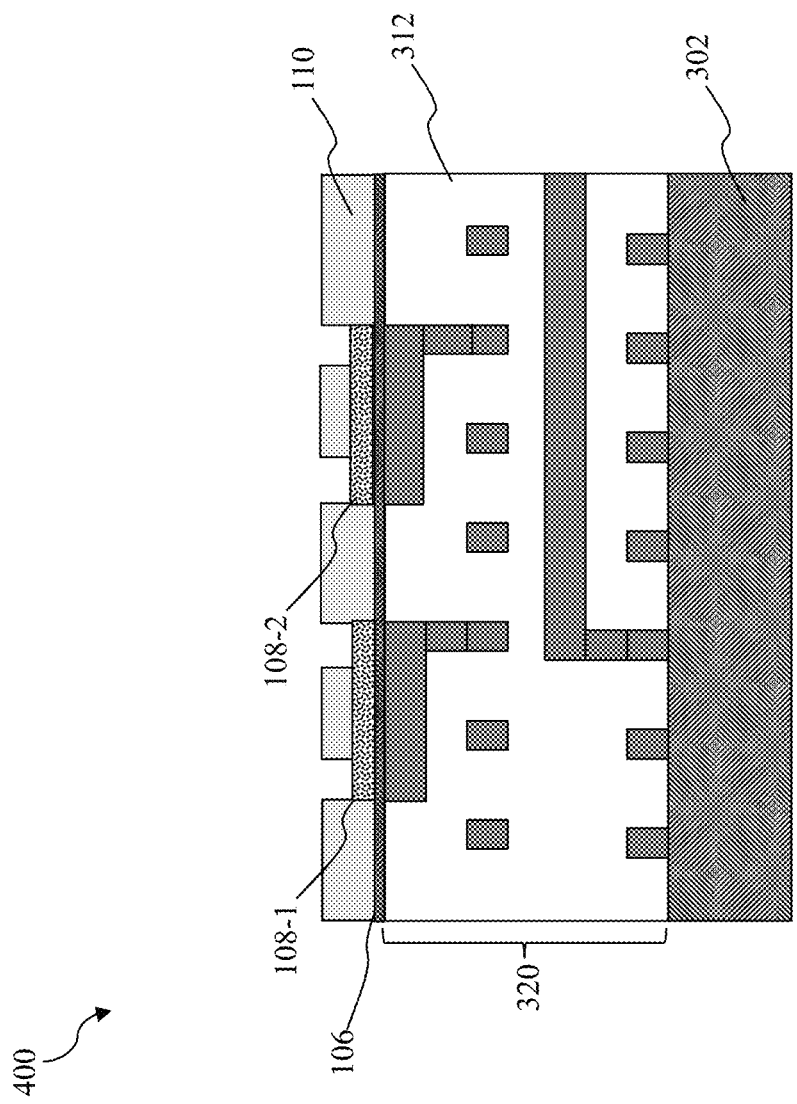

Referring now to FIGS. 10A-1 and 10A-2, source/drain openings 112 may be formed in the insulation layer 110. In some embodiments, a photolithography process may be used to pattern the insulation layer 110 to form the source/drain openings 112 that expose portions of the cuprous oxide features 108-1 or 108-2. Illustrations in FIG. 10A-1 represent embodiments where the dielectric layer 106 is patterned along with the cuprous oxide layer 108. Illustrations in FIG.

10A-2 represent embodiments where the dielectric layer 106 is not patterned or not substantially patterned along with the cuprous oxide layer 108.

Figure 10B:
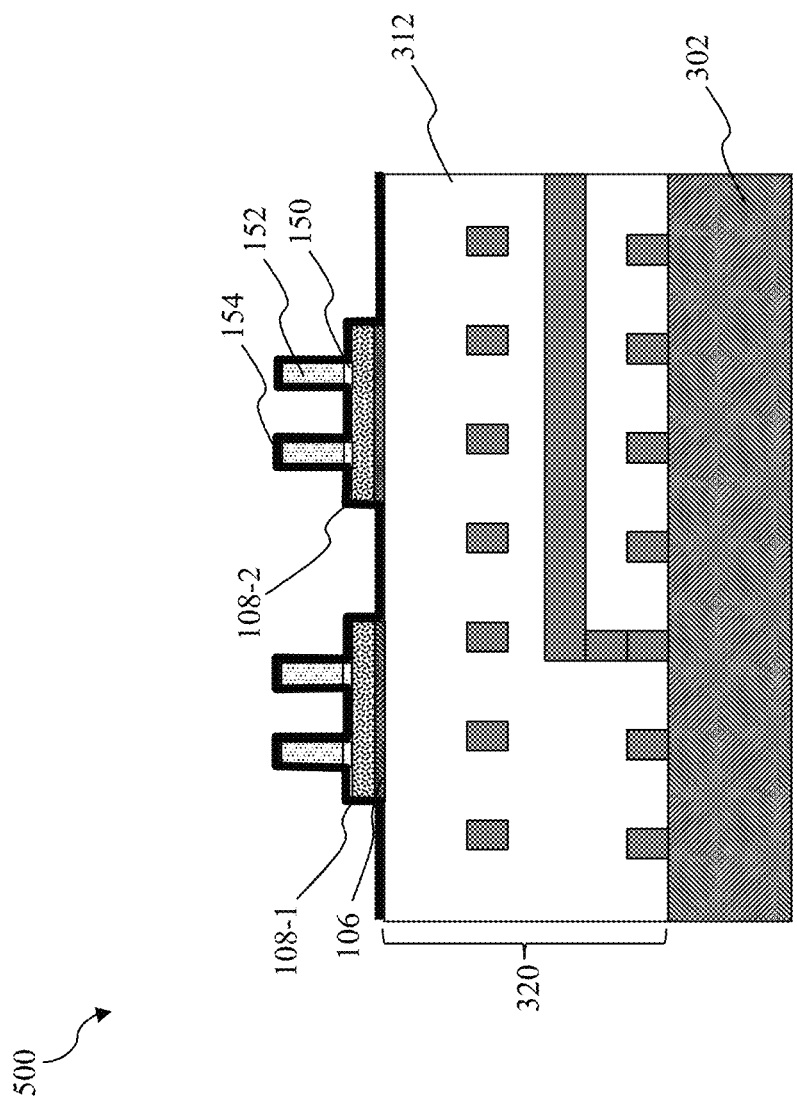

Referring to FIG. 10B, when a front gate TFT process is adopted, a gate spacer layer 154 is deposited over the workpiece 500, including over the gate electrodes 152 and the cuprous oxide features 108-1 and 108-2, and the exposed surface of the intermetal dielectric layer 312. In some embodiments, the gate spacer layer 154 may include silicon nitride, silicon oxynitride, silicon oxycarbonitride, silicon oxycarbide, or a combination thereof.

Figures 1, 11A:
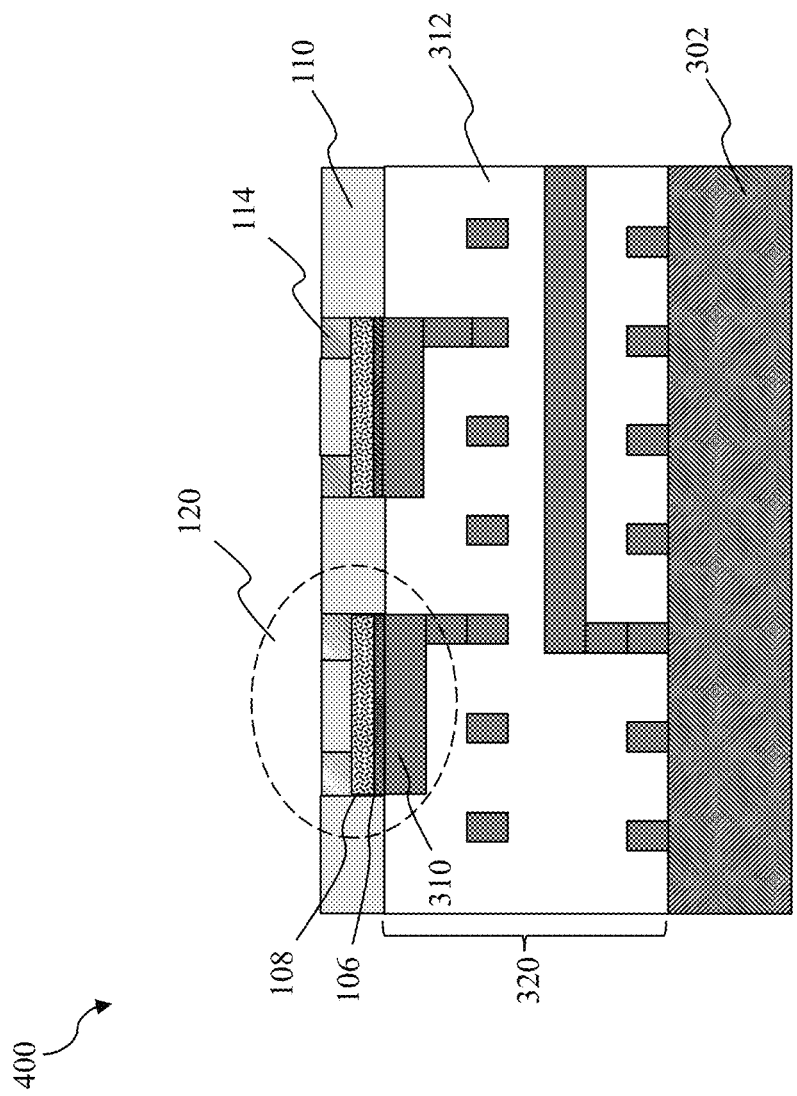
Figures 2, 11A:
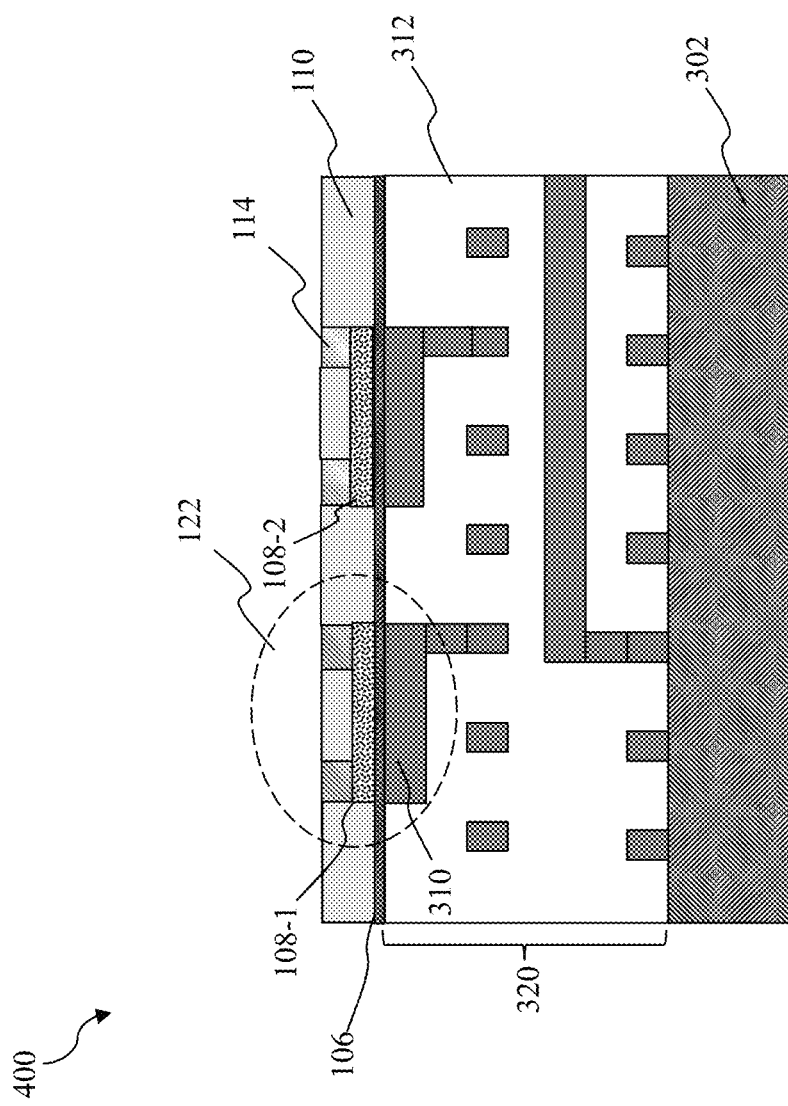

Referring now to FIGS. 11A-1 and 11A-2, a fill metal material may be deposited over the workpiece 400, including over and within the source/drain openings 112. In some instances, the fill metal material may include platinum (Pt), copper (Cu), tungsten (W), nickel (Ni), cobalt (Co), aluminum (Al), ruthenium (Ru), or molybdenum (Mo). After the fill metal material is deposited, the workpiece 400 may be subject to a planarization process to remove excess fill metal material over the insulation layer 110. As illustrated in FIGS. 11A-1 and 11A-2, the planarization process may form source/drain electrodes 114 that fill the source/drain openings 112 and are coupled to the cuprous oxide feature 108-1 or 108-2, each of which serves as a channel feature or semiconductor body of a TFT. Illustrations in FIG. 11A-1 represent embodiments where the dielectric layer 106 is patterned along with the cuprous oxide layer 108. Illustrations in FIG. 11A-2 represent embodiments where the dielectric layer 106 is not patterned or not substantially patterned along with the cuprous oxide layer 108. In some embodiments not separately illustrated in the present disclosure, a barrier layer may be deposited over the workpiece 400 before the deposition of the fill metal material. The barrier layer may be formed of metal nitride, such as tantalum nitride or titanium nitride, and may prevents oxidation of the fill metal material and improve adhesion between the cuprous oxide feature (108-1 or 108-2) and the source/drain electrodes 114. At this point, a TFT 120 in FIG. 11A-1 is substantially formed and a TFT 122 in FIG. 11A-2 is substantially formed.

Figure 11B:
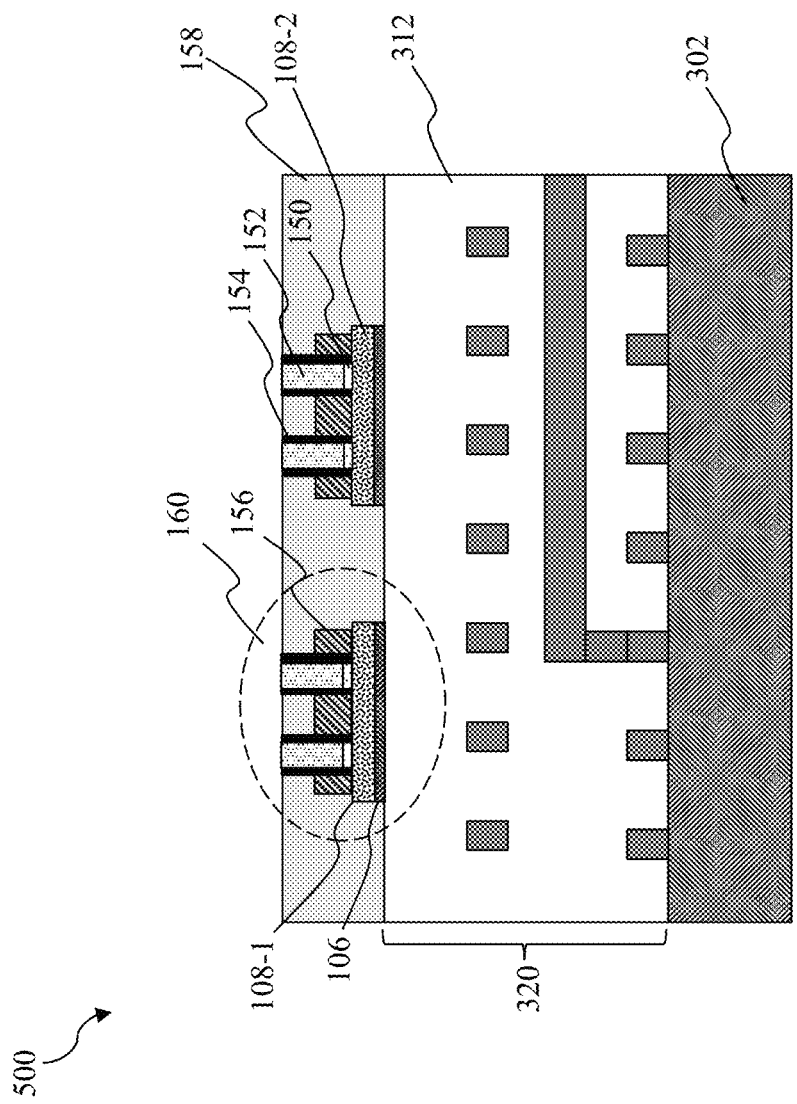

Referring to FIG. 11B, when a front gate TFT process is adopted, source/drain contacts 156 are formed adjacent to the gate electrode 152 but are spaced apart from the gate electrode 152 by the gate spacer layer 154. An insulation layer 158 is deposited over the workpiece 500, including over the gate electrodes 152 and the cuprous oxide features 108-1 and 108-2, and the exposed surface of the intermetal dielectric layer 312. In some embodiments, the source/drain contacts 156 may include platinum (Pt), copper (Cu), tungsten (W), nickel (Ni), cobalt (Co), aluminum (Al), ruthenium (Ru), molybdenum (Mo), a metal nitride. In some implementations, the insulation layer 158 and the insulation layer 110 may be formed of similar material. In those implementations, the insulation layer 158 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the insulation layer 158 may include more than two layers or may be formed in two steps. For example, a first insulation layer may be formed over the workpiece 500 before the source/drain contacts 156 are formed. Source/drain openings are then formed through the first insulation layer and material for the source/drain contacts 156 are filled in the source/drain openings. Then a second insulation layer may be deposited over the workpiece 500. At this point, a TFT 160 in FIG. 11B is substantially formed.

Reference is still made to FIGS. 11A-1, 11A-2 and 11B. In one configuration, the TFT 120 in FIG. 11A-1, the TFT 122 in FIG. 11A-2 or the TFT 160 in FIG. 11B is a power gate transistor or an I/O transistor. In this configuration, the patterned or non-patterned dielectric layer 106 in FIGS. 11A-2 and 11A-2 may serves as or part of the gate dielectric layer and the fourth metal line layer 310 (or a portion thereof) serves as the gate electrode of the TFT 120 or the TFT 122. The fourth metal line layer 310 may turn on the TFT 120 or the TFT 122 to form a channel in the cuprous oxide feature 108-1, which serves as a channel feature or semiconductor body of the TFT 120 or TFT 122. Similarly, the cuprous oxide feature 108-2 also serves as a channel feature of a TFT similar to the TFT 120 or TFT 122. When a front gate TFT process is adopted, the gate electrodes 152 may turn on the TFT 160 to form a channel in the cuprous oxide feature 108-1, which serves as a channel feature or semiconductor body of the TFT 160 in FIG. 11B. Similarly, the cuprous oxide feature 108-2 also serves as a channel feature of a TFT similar to the TFT 160 in FIG. 11B.

Figure 12:
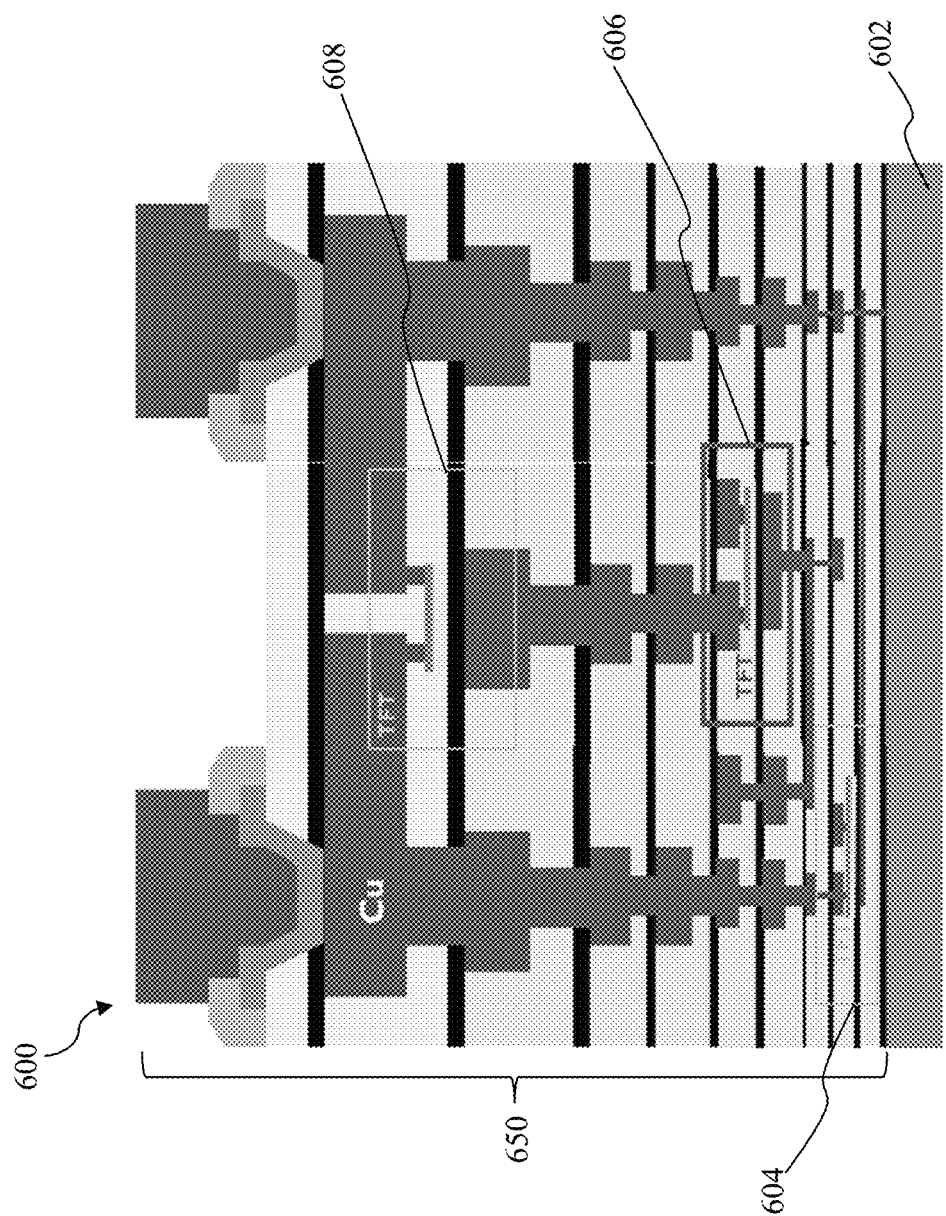

TFTs, such as the TFT 120 shown in FIG. 11A-1, the TFT 122 shown in FIG. 11A-2, or the TFT 160 shown in FIG. 11B may be placed at different levels in an interconnect structure. Reference is now made to FIG. 12, which illustrates an IC device 600 that includes a substrate 602 and an interconnect structure 650 that is disposed over the substrate 602. It is noted that the depiction of the IC device 600 is simplified and does not include all the features envisioned by the present disclosure. For example, the substrate 602 of the IC device 600 may include a semiconductor substrate and various devices and features fabricated at the FEOL and MEOL levels, including FinFETs, GAA transistors, and various contacts. Thin-film transistors that are similar to the TFT 120 in FIG. 11A-1, the TFT 122 in FIG. 11A-2, or the TFT 160 in FIG. 11B may be disposed at various levels in the interconnect structure 650. For example, a fragmentary cross-sectional view of the interconnect structure 650 in FIG. 12 includes three TFTs, including a first TFT 604, a second TFT 606, and a third TFT 608. In the embodiments represented in FIG. 12, the first TFT 604 is disposed over the second metal line layer over the substrate, the second TFT 606 is disposed over the fifth metal line layer over the substrate, and the third TFT 608 is disposed over the ninth metal line layer. In some embodiments, the first TFT 604, the second TFT 606 and the third TFT 608 may each serve as an I/O transistor or a power gate transistor.

Embodiments of the present disclosure provide advantages. In some embodiments, methods of the present disclosure include forming a dielectric layer over a crystalline copper layer. The dielectric layer serves as a restrictor to control the amount of oxygen supplied to a copper layer to form a copper-rich crystalline cuprous oxide layer in a plasma-enhanced oxidation process. Once formed, the crystalline cuprous oxide layer may then be transferred and fusion-bonded to different levels of an interconnect structure of a workpiece. Further operations of the methods of the present disclosure form TFTs out of the crystalline cuprous oxide layer for power gate or I/O operations. More particularly, the crystalline cuprous oxide layer may be used to form p-type transistors while conventional amorphous silicon and metal oxide transistors are more suitable for n-type transistors. Because the cuprous oxide layer is first formed and then attached to a workpiece, a crystalline cuprous oxide layer of good quality can be formed onto a surface of the workpiece at low process temperature, meeting the tight thermal budget for FEOL processing.

The present disclosure provides for many different embodiments. In one embodiment, a structure is provided. The structure includes an interconnect structure, an aluminum oxide layer over the interconnect structure, and a transistor formed over the aluminum oxide layer. The transistor includes cuprous oxide.

In some embodiments, the aluminum oxide layer includes a thickness between about 1 nm and about 5 nm. In some embodiments, the transistor is a p-type transistor. In some embodiments, the structure further includes a plurality of logic transistors. The transistor is in electrical communication with the plurality of logic transistors and the transistor is configured to switch off the plurality of logic transistors to reduce power consumption. In some implementations, a (111) crystal plane of the cuprous oxide in the transistor extends along a surface of the aluminum oxide layer.

In another embodiment, a method is provided. The method includes forming a copper layer over a carrier substrate, depositing an aluminum oxide layer over the copper layer, and igniting an oxygen-containing plasma over the aluminum oxide layer to form a crystalline cuprous oxide layer between the copper layer and the aluminum oxide layer.

In some embodiment, the carrier substrate is a sapphire substrate. In some embodiments, the aluminum oxide layer includes a thickness between about 1 nm and about 5 nm. In some embodiments, the copper layer is a crystalline copper layer having a (111) crystal plane. In some implementations, the igniting of the oxygen-containing plasma includes a temperature between about 350° C. and about 450° C. In some instances, the oxygen-containing plasma includes oxygen gas or ozone. In some instances, the method further includes attaching the aluminum oxide layer to an interconnect structure and removing the carrier substrate and the copper layer. In some embodiments, the attaching of the aluminum oxide layer includes flipping over the carrier substrate. In some embodiments, wherein the attaching of the aluminum oxide layer includes annealing the carrier substrate and the interconnect structure.

In still another embodiment, a method is provided. The method includes forming a crystalline copper layer over a carrier substrate, depositing a dielectric layer over the crystalline copper layer, forming a crystalline cuprous oxide layer between the crystalline copper layer and the dielectric layer, attaching the dielectric layer to an interconnect structure, and removing the carrier substrate and the crystalline copper layer.

In some embodiments, the method further includes patterning the crystalline cuprous oxide layer to form a channel region and forming source/drain features over the channel region. In some embodiments, the crystalline copper layer is a crystalline copper layer having a (111) crystal plane. In some embodiments, the forming of the crystalline cuprous oxide layer includes igniting an oxygen-containing plasma over the dielectric layer to form the crystalline cuprous oxide layer between the crystalline copper layer and the dielectric layer. In some instances, the igniting of the oxygen-containing plasma includes a temperature between about 350° C. and about 450° C. In some embodiments, the oxygen-containing plasma includes oxygen gas or ozone.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a copper layer over a carrier substrate;
   depositing a dielectric layer over the copper layer;
   after the depositing of the dielectric layer, forming a cuprous oxide layer between the copper layer and the dielectric layer;
   attaching the dielectric layer to an interconnect structure; and
   after the attaching, removing the carrier substrate and the copper layer,
   wherein the interconnect structure comprises a metal line disposed in an intermetal dielectric layer,
   wherein top surfaces of the metal line and the intermetal dielectric layer are coplanar.

2. The method of claim 1, further comprising:
   patterning the cuprous oxide layer to form a cuprous oxide feature disposed directly over the metal line such that a portion of the dielectric layer is sandwiched between the cuprous oxide layer and the metal line; and
   form source/drain electrodes over the cuprous oxide layer.

3. The method of claim 1, wherein the carrier substrate comprises silicon (Si), hafnium oxide, silicon oxide, glass, magnesium oxide, aluminum oxide, silicon phosphide, indium phosphide, gallium arsenide, or silicon carbide.

4. The method of claim 1, wherein the copper layer is crystalline.

5. The method of claim 1, wherein the depositing of the copper layer comprises use of atomic layer deposition (ALD), molecular beam epitaxy (MBE), or metalorganic chemical vapor deposition (MOCVD).

6. The method of claim 1, wherein the copper layer comprises a (111) crystal plane extending along a top surface of the carrier substrate.

7. The method of claim 1, wherein the dielectric layer comprises aluminum oxide, hafnium oxide, titanium oxide, tantalum oxide, or zirconium oxide.

8. The method of claim 1, wherein the forming of the cuprous oxide layer comprises a plasma oxidation process.

9. The method of claim 8, wherein the plasma oxidation process comprises an oxidation temperature between about 300° C. and about 450° C.

10. A method, comprising:
    depositing a copper layer over a carrier substrate;
    depositing a dielectric layer over the copper layer;
    after the depositing of the dielectric layer, forming a cuprous oxide layer between the copper layer and the dielectric layer;
    attaching the dielectric layer to an interconnect structure that includes a metal line disposed in an intermetal dielectric layer;
    after the attaching, removing the carrier substrate and the copper layer;

after the removing, patterning the cuprous oxide layer to form a cuprous oxide feature disposed directly over the metal line such that a portion of the dielectric layer is sandwiched between the cuprous oxide layer and the metal line; and form source/drain electrodes over the cuprous oxide layer.

11. The method of claim 10, wherein the attaching comprises:

cleaning a surface of the dielectric layer and a surface of the interconnect structure in a cleaning process;

rinsing the surface of the dielectric layer and the surface of the interconnect structure with deionized water; and putting the surface of the dielectric layer and the surface of the interconnect structure in contact with each other.

12. The method of claim 11, wherein the attaching further comprises performing an anneal process.

13. The method of claim 10, wherein the removing comprises a planarization process, a dry etch process, or a wet etch process.

14. The method of claim 10, wherein the forming of the source/drain electrodes comprises:

depositing an insulating layer over the cuprous oxide layer;

forming source/drain openings in the insulating layer to expose the cuprous oxide layer; and depositing a metal material layer over the source/drain openings.

15. The method of claim 10, wherein top surfaces of the metal line and the intermetal dielectric layer are coplanar.

16. A method, comprising:

forming a crystalline copper layer over a carrier substrate;

depositing a dielectric layer over the crystalline copper layer;

after the depositing, forming a crystalline cuprous oxide layer between the crystalline copper layer and the dielectric layer;

attaching the dielectric layer to an interconnect structure;

removing the carrier substrate and the crystalline copper layer;

patterning the crystalline cuprous oxide layer to form a channel region; and forming source/drain features over the channel region, wherein the interconnect structure comprises a metal line disposed in an intermetal dielectric layer.

17. The method of claim 16, wherein the carrier substrate comprises silicon (Si), hafnium oxide, silicon oxide, glass, magnesium oxide, aluminum oxide, silicon phosphide, indium phosphide, gallium arsenide, or silicon carbide.

18. The method of claim 16, wherein the dielectric layer comprises aluminum oxide, hafnium oxide, titanium oxide, tantalum oxide, or zirconium oxide.

19. The method of claim 16, wherein the attaching comprises:

cleaning a surface of the dielectric layer and a surface of the interconnect structure in a cleaning process;

rinsing the surface of the dielectric layer and the surface of the interconnect structure with deionized water; and putting the surface of the dielectric layer and the surface of the interconnect structure in contact with each other.

20. The method of claim 16, wherein the dielectric layer comprises a thickness between about 1 nm and about 5 nm.

* * * * *